United States Patent
Dudek

(10) Patent No.: US 10,312,381 B2
(45) Date of Patent: Jun. 4, 2019

(54) III-V SEMICONDUCTOR DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 15/936,330

(22) Filed: Mar. 26, 2018

(65) Prior Publication Data

US 2018/0277687 A1    Sep. 27, 2018

(30) Foreign Application Priority Data

Mar. 24, 2017  (DE) .................. 10 2017 002 935

(51) Int. Cl.
*H01L 29/872* (2006.01)
*H01L 29/32* (2006.01)
(Continued)

(52) U.S. Cl.
CPC ............ *H01L 29/872* (2013.01); *H01L 29/20* (2013.01); *H01L 29/32* (2013.01); *H01L 29/36* (2013.01);
(Continued)

(58) Field of Classification Search
CPC ............................................... H01L 21/02546
See application file for complete search history.

(56) References Cited

U.S. PATENT DOCUMENTS 5,733,815 A     3/1998  Ashkinazi et al.
2005/0006673 A1*  1/2005  Samuelson ............ B82Y 10/00
                                                257/232
(Continued)

FOREIGN PATENT DOCUMENTS

WO    WO2013028973 A1    2/2013

OTHER PUBLICATIONS

Kozlov et al, "Defect engineering for carrier lifetime control in high voltage GaAs power diodes", 25$^{th}$ Annual Semi Advanced Semiconductor manufacturing conference (ASMC 2014), IEEE, May 19, 2014, pp. 139-144, XP032614174, DOI: 10.1109/ASMC.2014/6847011.

(Continued)

*Primary Examiner* — Walter H Swanson
(74) *Attorney, Agent, or Firm* — Muncy, Geissler, Olds & Lowe, P.C.

(57) ABSTRACT

A stacked III-V semiconductor diode that has an n$^+$ layer having a dopant concentration of at least $10^{19}$ N/cm$^3$, an n$^-$ layer having a dopant concentration of $10^{12}$ N/cm$^3$ to $10^{16}$ N/cm$^3$, a layer thickness of 10 μm to 300 μm, a p$^+$ layer having a dopant concentration of $5 \cdot 10^{18}$ N/cm$^3$ to $5 \cdot 10^{20}$ cm$^3$ and a layer thickness greater than 2 μm, the layers following each other in the specified order, each including a GaAs compound or being made from a GaAs compound and having a monolithic design, the n$^+$ layer or the p$^+$ layer being a substrate, and a lower side of the n$^-$ layer being integrally connected to an upper side of the n$^+$ layer. The stacked III-V semiconductor diode including a first defect layer having a layer thickness greater than 0.5 μm, the defect layer being situated within the n$^-$ layer.

14 Claims, 2 Drawing Sheets

(51) Int. Cl.
  *H01L 29/861* (2006.01)
  *H01L 29/20* (2006.01)
  *H01L 29/36* (2006.01)
  *H01L 29/66* (2006.01)
  *H01L 21/02* (2006.01)
  *H01L 21/18* (2006.01)
  *H01L 21/265* (2006.01)
  *H01L 21/306* (2006.01)

(52) U.S. Cl.
  CPC ...... *H01L 29/861* (2013.01); *H01L 21/02546* (2013.01); *H01L 21/187* (2013.01); *H01L 21/26546* (2013.01); *H01L 21/30625* (2013.01); *H01L 29/66204* (2013.01); *H01L 29/66212* (2013.01)

(56) References Cited

U.S. PATENT DOCUMENTS

| | | | |
|---|---|---|---|
| 2006/0281263 | A1 | 12/2006 | Yamazaki et al. |
| 2013/0034924 | A1* | 2/2013 | Lochtefeld ........ H01L 21/02381 438/47 |
| 2017/0256656 | A1* | 9/2017 | Park .................... H01L 29/0657 |

OTHER PUBLICATIONS

G. Ashkinazi et al: "Process and Device Characterization of High Voltage Gallium Arsenide P—i—N Layers grown by an Improved Liquid Phase Epitaxy Method", Jan. 1, 1993, pp. 1749-1755, XP055498521.

Tom Simon et al, "Gallium aresenide semiconductor parameters extracted from pin diode measurements and simulations", IET Power Electronics, Bd. 9, Nr. 4, Mar. 30, 2016, pp. 689-697, XP055498441, UK ISSN: 1755-4535, DOI: 10.1049/iet-pel. 2015. 0019.

Ashkinazi, "GaAs Power Devices," ISBN 965-7094-19-4, pp. 8-9 (1999).

A. Koel et al, "Characterization of the temperature dependent behavior of snappy phenomenon by the switching-off of GaAs power diode structures", Advances in Fluid Mechanics XI, Bd. 1, Jul. 2014, Seiten 439-449, XP055545469, ISSN: 1746-4471, DOI: 10.2495/HT140381 ISBN: 978-1-78466-105-2.

Viktor Voitovich et al: "LPE technology for power GaAs diode structures", Estonian Journal of Engineering, Bd. 16, Nr. 1, Jan. 2010, Seiten 11-22, XP055498749, DOI: 10.3176/eng.2010.1.04.

* cited by examiner

III-V SEMICONDUCTOR DIODE

This nonprovisional application claims priority under 35 U.S.C. § 119(a) to German Patent Application No. 10 2017 002 935.0, which was filed in Germany on Mar. 24, 2017, and which is herein incorporated by reference.

BACKGROUND OF THE INVENTION

Field of the Invention

The invention relates to a III-V semiconductor diode.

Description of the Background Art

A high voltage-resistant semiconductor diode $p^+$-n-$n^+$ is known from "GaAs Power Devices" by German Ashkinazi, ISBN 965-7094-19-4, pages 8 and 9. It is desirable for high voltage-resistant semiconductor diodes to have not only the high voltage resistance but also both low on-state resistances and low leakage currents in the cutoff region.

SUMMARY OF THE INVENTION

It is therefore an object of the invention to provide a device which refines the prior art.

According to an exemplary embodiment, a stacked III-V semiconductor diode is provided, including an $n^+$ layer, an $n^-$ layer and a $p^+$ layer.

The $n^+$ layer has an upper side, a lower side, a dopant concentration of at least $10^{19}$ N/cm$^3$ and a layer thickness between 10 µm and 675 µm, preferably between 50 µm and 400 µm, the $n^+$ substrate including a GaAs compound or being made from a GaAs compound.

The $n^-$ layer has an upper side, a lower side, a dopant concentration of $10^{12}$ N/cm$^3$ to $10^{16}$ N/cm$^3$ and a layer thickness of 10 µm to 300 µm and includes a GaAs compound or is made from a GaAs compound.

The $p^+$ layer has an upper side, a lower side, a dopant concentration of $5\cdot10^{18}$ N/cm$^3$ to $5\cdot10^{20}$ N/cm$^3$ and a layer thickness between 0.5 µm and 50 µm and includes a GaAs compound or is made from a GaAs compound.

The layers follow each other in the specified order and have a monolithic design, the $n^+$ layer or the $p^+$ layer being designed as a substrate, and the lower side of the $n^-$ layer being integrally connected to the upper side of the $n^+$ layer.

The stacked III-V semiconductor diode also includes a first defect layer. The first defect layer has a layer thickness between 0.5 µm and 30 µm, the defect layer being disposed within the $n^-$ layer, and the defect layer having a defect concentration in a range between $1\cdot10^{14}$ N/cm$^3$ and $5\cdot10^{17}$ N/cm$^3$.

It should be noted that the layer are manufactured with the aid of liquid phase epitaxy or with the aid of an MOVPE system.

The defect layer may be created in different ways, for example by means of implantation or by introducing foreign atoms, and a recombination of charge carriers is achieved within the defect layer.

The defect layer can be not formed within the space-charge zone. The thickness of the $n^-$ layer is preferably designed in such a way that the defect layer is situated at a distance from the space-charge zone.

An advantage is that, by incorporating the defect layer, the level of the leakage current in the on-state region is reduced while the component properties are nearly uninfluenced in the off-state region. Leakage currents are disadvantageously noticeable at voltages above 1,000 V, in particular in the on-state region.

Moreover, the leakage currents increase markedly along with the temperature. By incorporating the defect layer, the leakage currents may be reduced by more than one magnitude compared to diodes without a defect layer. In addition, the manufacturing process becomes much more robust, i.e., insensitive to high background doping.

An advantage is that the III-V semiconductor diode according to the invention makes it possible to easily produce low leakage currents with reverse voltages in a range from 200 V to 3,300 V, using lower turn-on resistances and lower capacitances per unit area than conventional high-blocking diodes made from Si or SiC. Switching frequencies from 30 kHz up to 0.5 GHz and current densities from 0.5 A/mm$^2$ to 5 A/mm$^2$ are achievable hereby.

An advantage is that the III-V semiconductor diodes are more cost-effective than comparable high-blocking diodes made from SiC.

In particular, the III-V semiconductor diodes may be used as a freewheeling diode.

The III-V semiconductor diodes according to the invention can have low turn-on resistances in a range between 1 mOhm and 200 mOhm. The capacitances per unit area are in a range between 2 pF and 100 pF.

Another advantage of the III-V semiconductor diode according to the invention is a high thermal stability of up to 300° C. In other words, the III-V semiconductor diodes may also be used in hot environments. Low leakage currents are particularly helpful due to the exponential increase as the temperature rises.

In an embodiment, the defect concentration is in a range between $1\cdot10^{13}$ N/cm$^3$ and $5\cdot10^{16}$ N/cm$^3$. In an embodiment, the thickness of the defect layer is between 0.5 µm and 50 µm.

In an embodiment, the first defect layer has a distance from the lower side of the $n^-$ layer of at least half the layer thickness of the $n^-$ layer.

According to an embodiment, the semiconductor diode includes a second defect layer, the second defect layer having a layer thickness in a range between 0.5 µm and 50 µm and a defect concentration in a range between $1\cdot10^{13}$ N/cm$^3$ and $5\cdot10^{16}$ N/cm$^3$ and a distance from the upper side of the $n^-$ layer of no more than half the layer thickness of the $n^-$ layer. The defect concentration of the first defect layer can differ from the second defect layer.

In an embodiment, the first defect layer and/or a second defect layer can have at least one first layer area having a first defect concentration and a second layer area having a second defect concentration and, in particular, follow(s) a statistical, preferably Gaussian, distribution via the layer thickness of the first defect layer and/or a second defect layer. In other words, the defect concentration can be variable along the thickness of the defect layer.

According to an embodiment, the first defect layer and/or the second defect layer can include(s) Cr and/or indium and/or aluminum. Cr can be introduced into the $n^-$ layer during the epitaxy process. One advantage of introducing Cr is that the number of defects, and thereby the number of recombination centers, may be cost-effectively and easily set with the aid of the concentration of Cr without interrupting the epitaxy process.

In an embodiment, the defects in the first defect layer and/or in the second defect layer can be created by implanting atoms or molecules or by electron-beam irradiation. $H_2$ molecules having the corresponding energy and dosage can be used to create the defects.

In an embodiment, the III-V semiconductor diode can include an n-doped or p-doped intermediate layer having a layer thickness of 1 μm to 50 μm and a dopant concentration of $10^{12}$ N/cm$^3$ to $10^{17}$ N/cm$^3$, the intermediate layer being integrally connected to the p$^+$ layer and to the n$^-$ layer.

According to an embodiment, a total height of the stacked layer structure, comprising the p$^+$ layer, the n$^-$ layer and the n$^+$ layer, can be between 150 μm and 800 μm.

According to an embodiment, the stacked layer structure, comprising the p$^+$ layer, the n$^-$ layer and the n$^+$ layer, can have a rectangular or square surface, with edge lengths between 1 mm and 10 mm, or a round, for example oval or circular, surface.

According to an embodiment, the p$^+$ layer of the semiconductor diode can be replaced by a terminal contact layer, the terminal contact layer including a metal or a metallic compound or being made from a metal or a metallic compound and forming a Schottky contact.

In an embodiment, the III-V semiconductor diode can have a monolithic design, i.e. the individual monolithically formed layers are also monolithically formed with respect to each other. In an embodiment, the III-V semiconductor diode includes at least one semiconductor bond.

It should be noted that the expression, semiconductor bond, is used synonymously with the expression, wafer bond.

In an embodiment, in the stacked layer structure comprising the p$^+$ substrate, the n$^-$ layer and the n$^+$ layer, the semiconductor bond is formed between the n$^-$ layer and the p$^+$ substrate.

In an embodiment, the layer structure comprising a p$^+$ substrate forms a first partial stack, and the layer structure comprising the n$^+$ layer and the p$^-$ layer forms a second partial stack.

In an embodiment, the stacked layer structure includes an intermediate layer disposed between the p$^+$ substrate and the n$^-$ layer. The first partial stack includes the intermediate layer. The semiconductor bond is disposed between the intermediate layer and the n$^-$ layer.

In an embodiment, the first partial stack is formed in that the intermediate layer is produced, starting from a p$^+$ substrate, with the aid of epitaxy.

The intermediate layer designed as the p$^-$ layer can have a doping of less than $10^{13}$ N/cm$^{-3}$ or a doping between $10^{13}$ N/cm$^{-3}$ and $10^{15}$ N/cm$^{-3}$. In an embodiment, the p$^+$ substrate can be reduced to a thickness between 200 μm and 500 μm upstream or downstream from the bonding, using a grinding process.

In an embodiment, the first partial stack and the second partial stack can each be provided with a monolithic design.

In an embodiment, the second stack is formed in that, starting from an n$^-$ substrate, the n$^-$ substrate is connected to the second stack using another wafer bonding process.

In an process step, the n$^-$ substrate is reduced to the desired thickness. The thickness of the n$^-$ substrate can be in a range between 50 μm and 250 μm. The doping of the n$^-$ substrate can be in a range between $10^{13}$ N/cm$^{-3}$ and $10^{15}$ N/cm$^{-3}$.

One advantage of the wafer bonding is that it is readily possible to produce thick n$^-$ layers. A long deposition process during epitaxy is eliminated thereby. The number of stack errors in the thick n$^-$ layers may also be reduced with the aid of the bonding.

In an embodiment, the defect layer can be generated prior to the bonding by implanting ions into the surface of the second partial stack.

In an embodiment, the n$^-$ substrate can have a doping of greater than $10^{10}$ N/cm$^{-3}$ and less than $10^{13}$ N/cm$^{-3}$. If the doping is extremely low, the n$^-$ substrate may also be construed as an intrinsic layer.

In one refinement, after reducing the thickness of the n$^-$ substrate, the n$^+$ layer can be generated on the n$^-$ substrate in a range between $10^{18}$ N/cm$^{-3}$ and less than $5\times10^{19}$ N/cm$^{-3}$ with the aid of epitaxy or high-dose implantation.

The reduction in the thickness of the n$^-$ substrate can take place with the aid of a CMP step, i.e. with the aid of chemical, mechanical polishing.

In an embodiment, an auxiliary layer is applied to the front of the diode structure. The back of the diode structure may then be reduced in thickness and placed on a carrier. In an embodiment, the auxiliary layer is subsequently removed from the front.

In an embodiment, the surface of the n$^+$ substrate and the surface of the p$^+$ substrate can be metallized to electrically connect the semiconductor diode. Following the metallization, the cathode of the semiconductor diode can be integrally connected to a base designed as a heat sink. In other words, the anode is formed on the surface of the diode, on the P$^+$ layer.

Different reverse voltages are achievable with certain combinations of a p$^-$ intermediate layer and an n$^-$ layer.

In an example, the p$^-$ intermediate layer encompasses a thickness between 10 μm and 25 μm and a thickness between 40 μm and 90 μm for the p$^-$ layer, resulting in a reverse voltage of approximately 900 V.

In an example the p$^-$ intermediate layer encompasses a thickness between 25 μm and 35 μm and a thickness between 40 μm and 70 μm for the p$^-$ layer, resulting in a reverse voltage of approximately 1,200 V.

In an example, the p$^-$ intermediate layer encompasses a thickness between 35 μm and 50 μm and a thickness between 150 μm and 70 μm for the p$^-$ layer, resulting in a reverse voltage of approximately 1,500 V.

The diodes in the above examples may also be referred to as punch-through diodes.

In an example, the p$^-$ intermediate layer encompasses a thickness between 10 μm and 25 μm and a thickness between 60 μm and 110 μm for the p$^-$ layer.

In an example, the p$^-$ intermediate layer encompasses a thickness between 10 μm and 25 μm and a thickness between 70 μm and 140 μm for the p$^-$ layer.

In an example, the p$^-$ intermediate layer encompasses a thickness between 35 μm and 50 μm and a thickness between 80 μm and 200 μm for the p$^-$ layer.

The diodes in the directly above examples may also be referred to as non-reach-through diodes.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
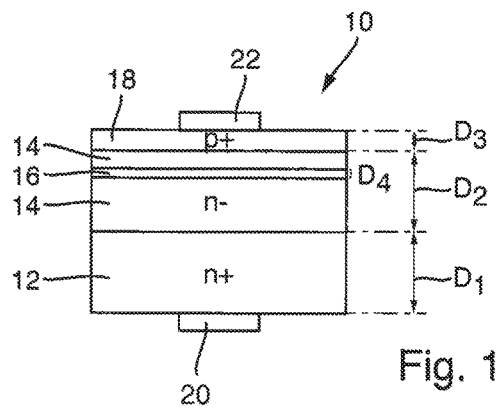
FIG. 1 shows a view of a first specific embodiment according to the invention of a III-V semiconductor diode.

The illustration in FIG. 1 shows a view of a first specific embodiment of a stacked III-V semiconductor diode 10 according to the invention, including an $n^+$ layer 12 as a substrate, a low-doped $n^-$ layer 14 integrally connected to $n^+$ layer 12, and a $p^+$ layer 18 integrally connected to $n^-$ layer 14, as well as a first contact 20 and a second contact 22. A defect layer 16 is disposed within $n^-$ layer 14.

First contact 20 is integrally connected to a lower side of $n^+$ layer 12, while second contact 22 is integrally connected to an upper side of $p^+$ layer 18.

The $n^+$ layer 12 is highly n-doped and has a dopant concentration of $10^{19}$ N/cm$^3$. A layer thickness D1 of $n^+$ layer 12 is between 100 μm and 675 μm.

The $n^-$ layer 14 is low n-doped and has a dopant concentration of $10^{12}$ N/cm$^3$ to $10^{16}$ N/cm$^3$ and a layer thickness D2 of 10 μm to 300 μm.

The $p^+$ layer 18 is highly p-doped and has a dopant concentration of $10^{19}$ N/cm$^3$ and a layer thickness D3 greater than 2 μm.

Defect layer 16 has a layer thickness D4 in a range between 0.5 μm and 50 μm and a defect density in a range between $1 \cdot 10^{13}$ N/cm$^3$ and $5 \cdot 10^{16}$ N/cm$^3$.

Figure 2:
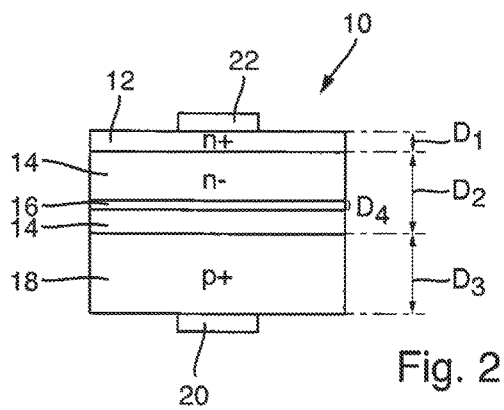
FIG. 2 shows a view of a second specific embodiment according to the invention of a III-V semiconductor diode.

The illustrations in FIG. 2 show a second specific embodiment of a III-V semiconductor diode, the difference from the illustration in FIG. 1 being that $p^+$ layer 18 is designed as a substrate, upon which the other layers follow.

Figure 3A:
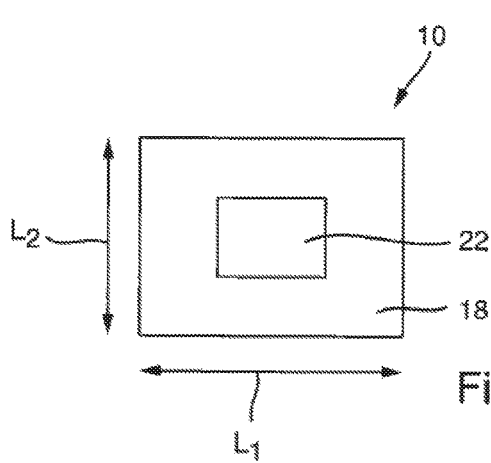
FIGS. 3a and 3b show a top view of the III-V semiconductor diode from FIG. 1 or from FIG. 2.
Figure 3B:
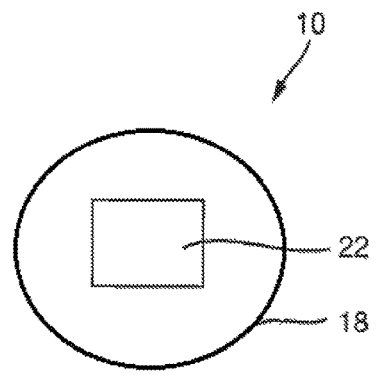

The illustrations in FIGS. 3a and 3b show a top view of the first specific embodiment of a III-V semiconductor diode according to the invention shown in FIG. 1. Only the differences from the illustration in FIG. 1 are explained below.

Stacked layer structure 100 of III-V semiconductor diode 10, which comprises $n^+$ substrate 12, $n^-$ layer 14 surrounding defect layer 16 and $p^+$ layer 18, has a rectangular circumference and thus also a rectangular surface with edge lengths L1 and L2. Contact surface 22 disposed on the surface of layer sequence 100 covers only one part of the surface.

In another specific embodiment, which is not illustrated, the corners of stacked layer structure 100 are rounded to avoid field strength peaks at high voltages.

In another specific embodiment, which is not illustrated, the surface of stacked layer structure 100 is provided with a round design. Peaks in the field strength are particularly effectively reduced hereby. The surface preferably has a circular or oval design.

Figure 4:
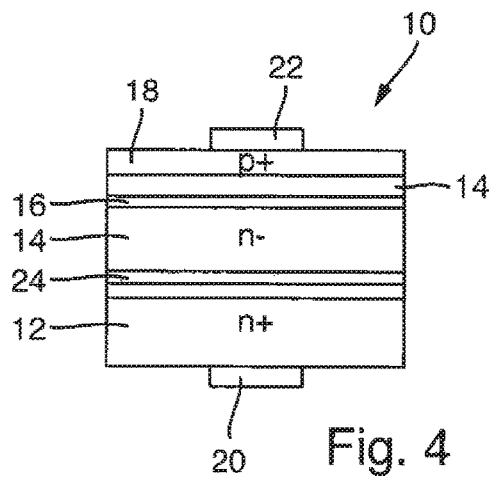
FIG. 4 shows a view of a third specific embodiment according to the invention of a III-V semiconductor diode.

A refinement of the III-V semiconductor diode from FIG. 1 is shown in the illustration in FIG. 4, $n^-$ layer 14 of semiconductor diode 10 having a second defect layer 24, in contrast to the first specific embodiment.

Figure 5:
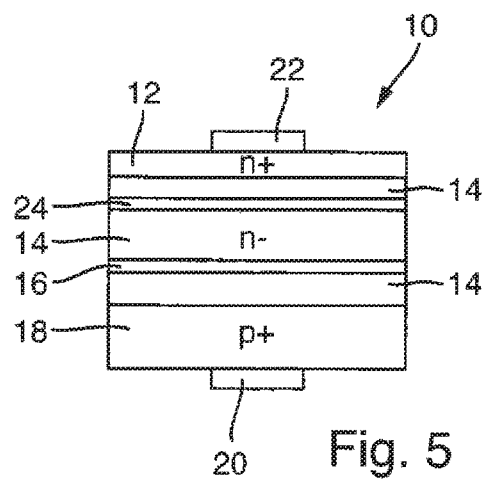
FIG. 5 shows a view of a fourth specific embodiment according to the invention of a III-V semiconductor diode.

A refinement of the III-V semiconductor diode from FIG. 2 is shown in the illustration in FIG. 5, $n^-$ layer 14 of semiconductor diode 10 having a second defect layer 24, in contrast to the second specific embodiment.

Four alternative refinements of the III-V semiconductor diode from FIG. 1 are shown in the illustrations in FIGS. 6 and 7, only the differences from FIG. 1 being explained below.

Figure 6:
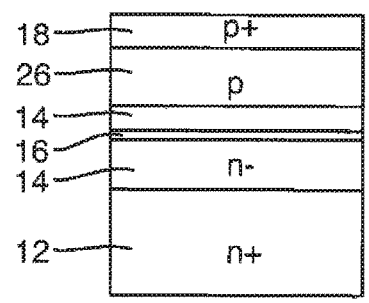
FIG. 6 shows a view of a fifth specific embodiment according to the invention of a III-V semiconductor diode.
Figure 7:
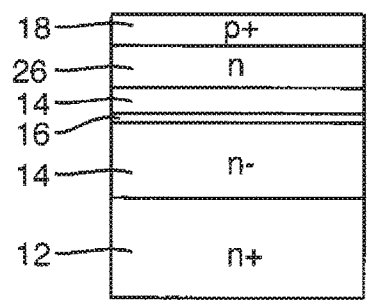
FIG. 7 shows a view of a sixth specific embodiment according to the invention of a III-V semiconductor diode.

According to a first specific embodiment, the semiconductor diode includes a low p-doped intermediate layer 26 between $n^-$ layer 14 and $p^+$ layer 18, as illustrated in FIG. 6. Alternatively, intermediate layer 26 is n-doped, as illustrated in FIG. 7.

Four alternative refinements of the III-V semiconductor diode from FIG. 2 are shown in the illustrations in FIGS. 8 and 9, only the differences from FIG. 2 being explained below.

Figure 8:
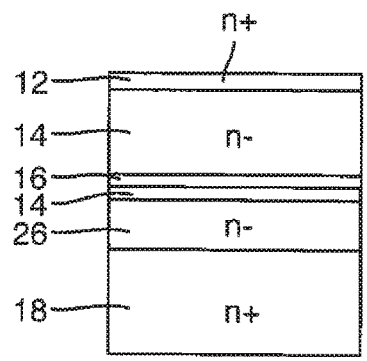
FIG. 8 shows a view of a seventh specific embodiment according to the invention of a III-V semiconductor diode.
Figure 9:
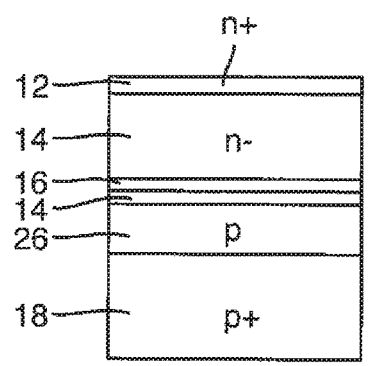
FIG. 9 shows a view of an eighth specific embodiment according to the invention of a III-V semiconductor diode.

According to a first specific embodiment, the semiconductor diode includes a low p-doped intermediate layer 26 between $n^-$ layer 14 and $p^+$ layer 18, as illustrated in FIG. 8. Alternatively, intermediate layer 26 is n-doped, as illustrated in FIG. 9.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor diode comprising:
    an $n^+$ layer having an upper side, a lower side, a dopant concentration of at least $10^{19}$ N/cm$^3$ and a layer thickness between 50 μm and 400 μm, the $n^+$ layer comprising a GaAs compound;
    an $n^-$ layer having an upper side, and a lower side, a dopant concentration of $10^{12}$ N/cm$^3$ to $10^{16}$ N/cm$^3$, a layer thickness of 10 μm to 300 μm, the $n^-$ layer comprising a GaAs compound;
    a $p^+$ layer having an upper side, a lower side, a dopant concentration of $5 \cdot 10^{18}$ N/cm$^3$ to $5 \cdot 10^{20}$ N/cm$^3$, a layer thickness of at least 2 μm, the $p^+$ layer comprising a GaAs compound; and
    a first defect layer having a layer thickness between 0.5 μm and 50 μm, the defect layer being arranged within the $n^-$ layer, the defect layer having a defect concentration in a range between $1 \cdot 10^{13}$ N/cm$^3$ and $5 \cdot 10^{16}$ N/cm$^3$,
    wherein the n+-layer, the n--layer, and the p+-layer are monolithically formed,
    wherein the $n^+$ layer or the $p^+$ layer is formed as a substrate, and
    wherein the lower side of the $n^-$ layer is integrally connected to the upper side of the $n^+$ layer.

2. The III-V semiconductor diode according to claim 1, wherein the first defect layer has a distance from the lower side of the n" layer of at least half the layer thickness of the n" layer.

3. The III-V semiconductor diode according to claim 1, wherein the semiconductor diode includes a second defect layer, the second defect layer having a layer thickness between 0.5 μm and 50 μm and a defect concentration between $1 \cdot 10^{13}$ N/cm$^3$ and $5 \cdot 10^{16}$ N/cm$^3$ and a distance from the upper side of the n" layer of no more than half the layer thickness of the n$^-$ layer.

4. The III-V semiconductor diode according to claim 1, wherein the first defect layer and/or a second defect layer each have a first layer area with a first detect concentration and a second layer area with a second defect concentration.

5. The III-V semiconductor diode according to claim 1, wherein the defect concentration over the layer thickness of the first defect layer and/or a layer thickness of a second defect layer follow a statistical distribution.

6. The III-V semiconductor diode according to claim 1, wherein the first defect layer and/or a second defect layer include Cr and/or indium and/or aluminum.

7. The III-V semiconductor diode according to claim 1, wherein the III-V semiconductor diode includes an n-doped or p-doped intermediate layer having a layer thickness of 1 μm to 50 μm and a dopant concentration of $10^{12}$ N/cm$^3$ to $10^{17}$ N/cm$^3$, the intermediate layer being integrally connected to the p$^+$ layer and to the n$^-$ layer.

8. The III-V semiconductor diode according to claim 1, wherein a total height of a stacked layer structure comprising the p$^+$ layer, the n$^-$ layer, and the n$^+$ layer, is no more than 150 μm to 800 μm.

9. The III-V semiconductor diode according to claim 1, wherein a stacked layer structure comprising the p$^+$ layer, the n$^-$ layer, and the n$^+$ layer has a rectangular or square surface with edge lengths between 1 mm and 10 mm.

10. The III-V semiconductor diode according to claim 1, wherein a stacked layer structure comprising the p$^+$ layer, the n$^-$ layer, and the n$^+$ layer has a round or oval or circular surface.

11. The III-V semiconductor diode according to claim 1, wherein the III-V semiconductor diode has a monolithic design or includes a semiconductor bond.

12. The III-V semiconductor diode according to claim 11, wherein the semiconductor bond is formed between the p$^+$ layer and the n$^-$ layer or between a p$^-$ layer and the n$^-$ layer.

13. The III-V semiconductor diode according to claim 1, wherein the n+ layer, the n− layer, or the p+ layer consists essentially of the GaAs compound.

14. A stacked III-V semiconductor diode comprising:
an n$^+$ layer having an upper side, a lower side, a dopant concentration of at least $10^{19}$ N/cm$^3$ and a layer thickness between 50 μm and 400 μm, the n$^+$ layer comprising a GaAs compound;
an n$^-$ layer having an upper side, and a lower side, a dopant concentration of $10^{12}$N/cm$^3$ to $10^{16}$ N/cm$^3$, a layer thickness of 10 μm to 300 μm, the n$^-$ layer comprising a GaAs compound;
a terminal contact layer; and
a first defect layer having a layer thickness between 0.5 μm and 50 μm, the defect layer being arranged within the n$^-$ layer, the defect layer having a defect concentration in a range between $1 \cdot 10^{13}$ N/cm$^3$ and $5 \cdot 10^{16}$ N/cm$^3$,
wherein the n+-layer, the n--layer, and the p+-layer are monolithically formed,
wherein the n$^+$ layer or the terminal contact layer is formed as a substrate, and
wherein the lower side of the n$^-$ layer is integrally connected to the upper side of the n$^+$ layer,
wherein the terminal contact layer includes a metal or a metallic compound or is made from the metal or the metallic compound and forms a Schottky contact.

* * * * *